United States Patent [19]
King et al.

[11] Patent Number: 6,046,591
[45] Date of Patent: Apr. 4, 2000

[54] MRI SYSTEM WITH FRACTIONAL DECIMATION OF ACQUIRED DATA

[75] Inventors: Kevin F. King, New Berlin; Jason A. Polzin, Lake Mills, both of Wis.

[73] Assignee: General Electric Company, Milwaukee, Wis.

[21] Appl. No.: 09/119,815

[22] Filed: Jul. 21, 1998

Related U.S. Application Data

[63] Continuation-in-part of application No. 09/039,436, Mar. 16, 1998.
[51] Int. Cl.[7] .......................................... G01V 3/00
[52] U.S. Cl. ........................ 324/309; 324/307; 324/306; 324/312
[58] Field of Search .................................. 324/306, 307, 324/309, 312, 300; 128/653.2

[56] References Cited

U.S. PATENT DOCUMENTS

| | | | |
|---|---|---|---|
| 4,952,877 | 8/1990 | Stormont et al. | 324/312 |
| 4,992,736 | 2/1991 | Stormont et al. | 324/309 |

Primary Examiner—Christine K. Oda
Assistant Examiner—Brij B. Shrivastav
Attorney, Agent, or Firm—Quarles & Brady; Christian G. Cabou; Phyllis Y. Price

[57] ABSTRACT

An MRI system acquires NMR signals and digitizes them at a fixed sample rate. A lower, prescribed sample rate is obtained by transforming the acquired NMR signal using a weighting function calculated from scan parameters. The transformation includes multiplying by the weighting function and convolving the NMR signal with the complex conjugate of the weighting function.

2 Claims, 3 Drawing Sheets

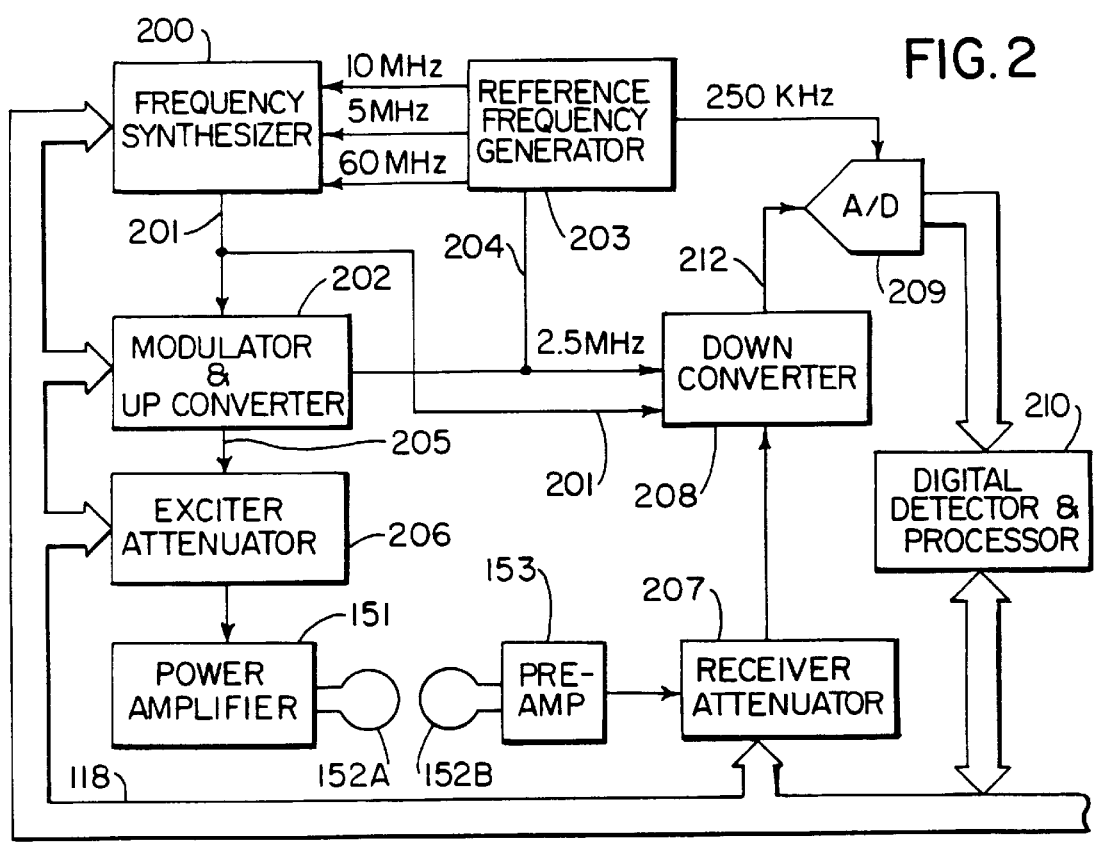

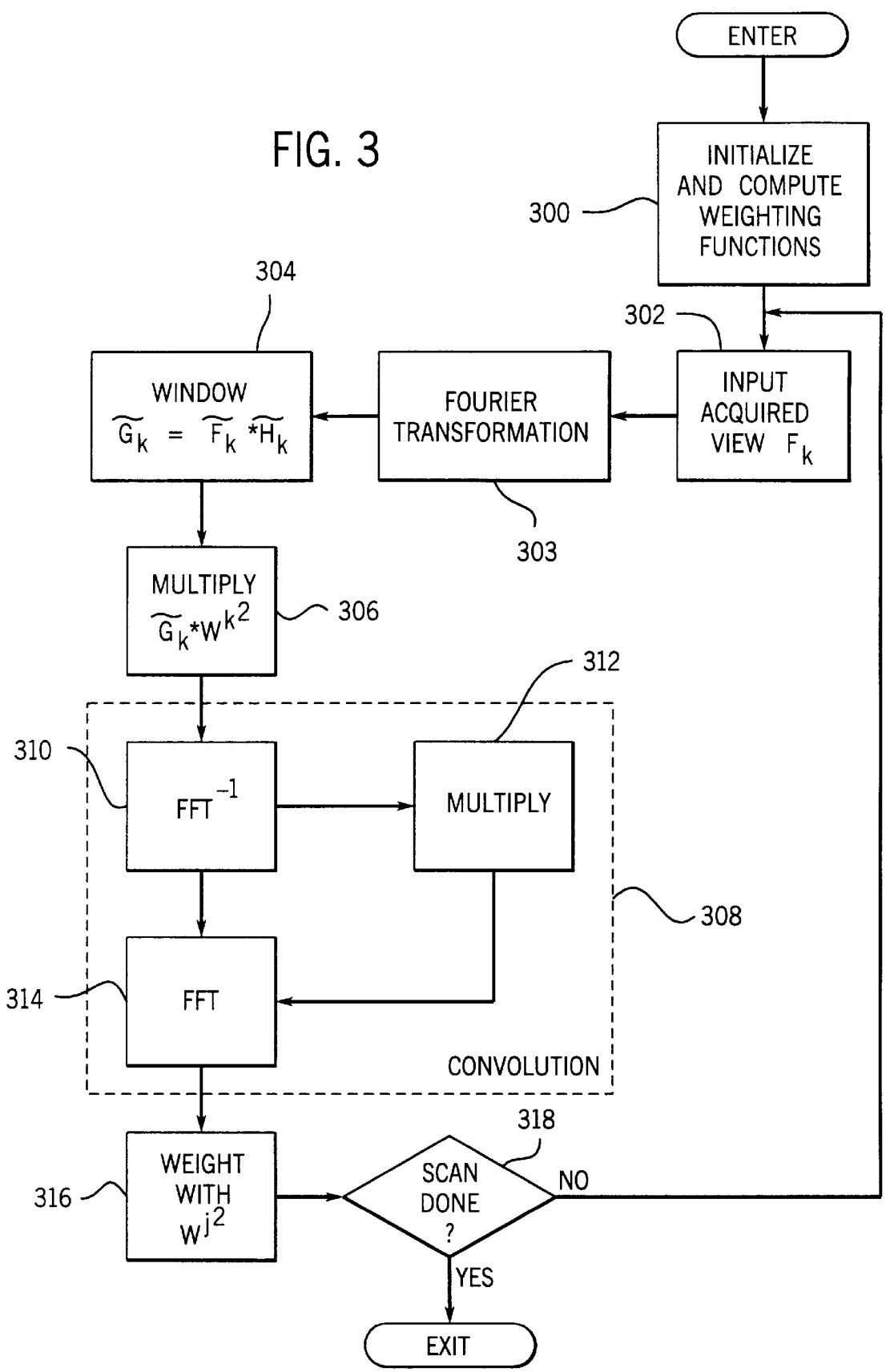

MRI SYSTEM WITH FRACTIONAL DECIMATION OF ACQUIRED DATA

RELATED APPLICATIONS

This is a continuation-in-part application of prior U.S. patent application Ser. No. 09/039,436, filed on Mar. 16, 1998 and entitled "MRI SYSTEM WITH FRACTIONAL DECIMATION OF ACQUIRED DATA."

BACKGROUND OF THE INVENTION

The field of the invention is nuclear magnetic resonance imaging methods and systems. More particularly, the invention relates to the sampling of acquired NMR signals at prescribed sample rates.

When a substance such as human tissue is subjected to a uniform magnetic field (polarizing field B), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The rate at which the received NMR signals are digitized is an important scan parameter. The signal-to-noise ratio of an NMR image can be improved if the effective bandwidth (which is the inverse of the sampling period per point) is reduced. This is usually accomplished by widening the read-out gradient pulse and reducing the amplitude of the read-out gradient to encode the positions into a narrower bandwidth and to retain the same spatial resolution. The anti-aliasing filters are modified to match the reduced bandwidth and the analog-to-digital conversion (A/D) sample rate is reduced to acquire the same number of samples over the longer read-out gradient pulse. The SNR improvement is proportional to the square root of the bandwidth reduction.

A higher SNR and corresponding lower A/D sample rate is not always desired, since the increase in SNR is accompanied by two disadvantages. First, the minimum echo delay ($TE_{1min}$) for the first NMR echo signal is increased due to the widening of the read-out gradient pulse. For some rf spin echo acquisitions the delay is twice what might be expected, since the time between the 90° RF excitation pulse and the 180° RF pulse must also be increased to orient the NMR echo signal at the center of the widened read-out gradient pulse. The lengthening of $TE_1$ is a disadvantage when $T_2$ weighting of the NMR image is not desired. A second disadvantage which accompanies this increase in SNR is an increase in chemical shift artifacts. Since the bandwidth per image pixel is reduced, the frequency difference between lipid and water resonances becomes more significant. For example, at 1.5 Tesla main field strength, the approximately 220 Hertz difference in resonant frequency will appear approximately three times further apart in an image where each image pixel represents a difference in frequency of 42 Hertz rather than 125 Hertz. The result is an increased relative displacement between the lipid structures and the water structures. This displacement can be especially disturbing with images reconstructed from the first NMR echo signal since the second echo signal often has lower lipid signal components due to the shorter $T_2$ decay time of lipids.

To allow maximum flexibility for each particular application in the SNR, spatial resolution and field of view of an image, a completely adjustable A/D sampling rate is desirable.

A number of methods have been used in prior MRI systems to enable the A/D sample rate to be precisely adjusted to enable the best image acquisition possible. One approach is to employ an analog-to-digital converter circuit ("ADC") in which the sample rate is adjustable and can be precisely controlled. Such ADCs are expensive.

Another approach is to employ an ADC which has a fixed sample rate far higher than that required to achieve the desired sample rates. In such designs the sample rate is reduced to the prescribed A/D sample rate by using decimation. The decimation ratio (d) is an integer value. Decimation effectively reduces the A/D sample rate to one-half (d=2) by selecting alternate digitized samples, to one-third (d=3) by selecting every third digitized sample, to one-fourth (d=4) by selecting every fourth digitized sample, etc. The difficulty with this method is that the effective A/D sample rate can only be changed in discrete steps. If the ADC sample rate is very high and the decimation ratio (d) necessary to achieve operable A/D sample rates is very high (e.g. d=10, 11, 12), these discrete steps are relatively small and a desired A/D sample rate can be achieved with reasonable accuracy. However, ADC devices that operate at such high sample rates are expensive.

SUMMARY OF THE INVENTION

The present invention is a method for using a fixed sample rate ADC to acquire NMR image data and produce an image data set at a prescribed sample rate. More specifically, the method includes calculating a weighting function based on scan parameters; windowing the acquired NMR signal; multiplying the windowed NMR signal by the weighting function; convolving the result by the complex conjugate of the weighting function; and multiplying that result by the weighting function to produce an output NMR signal at the prescribed sample rate.

A general object of the invention is to transform an acquired NMR signal to a prescribed sample rate. This is achieved by using a weighting function that is calculated from scan parameters that include the prescribed sample rate. The multiplication and convolution steps of the invention require less processing time than other, known transformation methods.

BRIEF DESCRIPTION OF THE DRAWINGS

FIG. 2 is an electrical block diagram of the transceiver which forms part of the MRI system of FIG. 1; and FIG. 3 is a flow chart of the method used by the MRI system of FIG. 1 to practice the present invention.

GENERAL DESCRIPTION OF THE INVENTION

Figure 1:
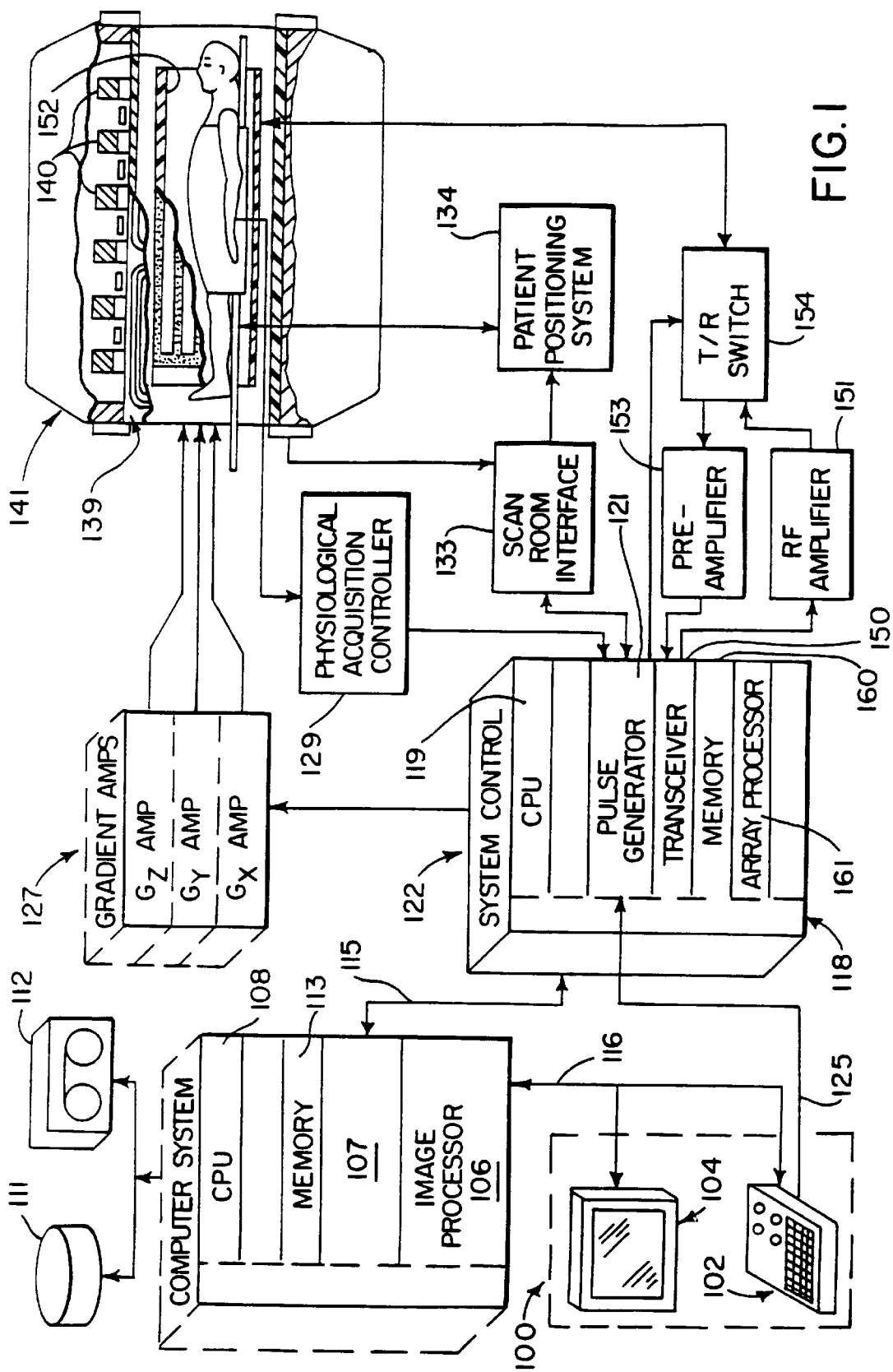
FIG. 1 is a block diagram of an MRI system which employs the present invention.

The present invention is implemented on each time domain NMR signal F(t) that is acquired and digitized at a fixed sample rate $1/(\Delta t_{A/D})$. The output is a time domain image data set $G_j$ which is a transformation of the NMR signal F(t) to the prescribed sample rate $1/\Delta t$.

Let F(t) be the time domain raw data for one acquired $k_y$ line and let $\tilde{F}(f)$ be the corresponding frequency domain data resulting after Fourier transformation of F(t), i.e.

$$\tilde{F}(f) = \int_{-\infty}^{\infty} F(t) e^{i2\pi f t} dt. \tag{1}$$

The functions F(t) and $\tilde{F}(f)$ are sampled, and the integral in Eq. 1 (continuous Fourier transform) is approximated by a sum (discrete Fourier transform). Let F(t) have duration $T_{max}$ with M samples at intervals $\Delta t_{A/D}$. The Fourier transform $\tilde{F}(f)$ also has M sampled values at intervals $$\Delta f = \frac{1}{T_{max}} = \frac{1}{M \Delta t_{A/D}}, \tag{2}$$

over a frequency range $F_{max}=1/(\Delta t_{A/D})$. Letting $f=k\Delta f$, $t=j\Delta t_{A/D}$, $F_k = F(k\Delta t_{A/D})$ and $\tilde{F}_j = \tilde{F}(j\Delta f)$, Eq. 1 becomes $$\tilde{F}_k = \sum_{j=0}^{M-1} F_j e^{i2\pi jk/M}. \tag{4}$$

If M is a power of 2, Eq. 4 can be implemented using the Fast Fourier Transform (FFT) operation which requires on the order of $2M \log_2 M$ operations. For M greater than about 8, the FFT is faster than the DFT.

$\tilde{F}_k$ Is windowed by multiplying by $\tilde{H}_k$ (The digital anti-aliasing filter) and transformed back into the time domain. Let $\tilde{G}_k = \tilde{F}_k \tilde{H}_k$ and let the subsequent resampled time domain NMR data set be $G_j$. We make the approximation that $\tilde{G}_k$ is compactly supported at a lower bandwidth than $\tilde{F}_j$ and that $G_j$ can therefore be sampled in the time domain at N intervals $\Delta t$ where $\Delta t > \Delta t_{A/D}$. $G_j$ is given by $$G_j = \sum_{k=0}^{M-1} \tilde{G}_k e^{-i2\pi(j\Delta f)(k\Delta f)}, \tag{5}$$

where $j=0, 1, 2, \ldots, N-1$. Using the definition $d=\Delta t/\Delta t_{A/D}$, and Eq. 2

$$\Delta f \Delta t = \frac{\Delta t}{M \Delta t_{A/D}} = \frac{d}{M}. \tag{6}$$

Eq. 5 becomes $$G_j = \sum_{k=0}^{M-1} \tilde{G}_k e^{-i2\pi jk(d/M)}, \tag{7}$$

Because of the factor d in the complex exponential, a single FFT cannot be used to evaluate Eq. 7. However $G_j$ can be efficiently computed using the present invention. Although more computationally intensive than a single FFT, it is much more efficient than a DFT.

Let $W = e^{-i\pi d/M}$. By completing the square we get the identity $$2jk = -(j-k)^2 + j^2 + k^2,$$

and we can write the complex exponential factor in Eq. 7 as $$e^{i2\pi jk(d/M)} = (e^{-i\pi d/M})^{2jk} = W^{2jk} = W^{-(j-k)^2 + j^2 + k^2} = W^{j^2} W^{k^2} W^{-(j-k)^2}. \tag{9}$$

Eq. 7 can be written $$G_j = W^{j^2} \sum_{k=0}^{M-1} (\tilde{G}_k W^{k^2}) W^{-(j-k)^2}. \tag{10}$$

Eq. 10 represents a discrete convolution of the functions $\tilde{G}_k W^{k^2}$ and $W^{-k^2}$ with a subsequent $W^{j^2}$ weighting. In the context of the convolution, the notation $\tilde{G}_k W^{k^2}$ and $W^{k^2}$ refers to two discrete functions. The index K in this case is a "dummy" index with no specific meaning and the notation $\tilde{G}_k W^{k^2}$ and $W^{-k^2}$ should be understood as referring to the two complete functions. The convolution can be performed using FFTs for efficiency. Note that $W^{-k^2}$ is the complex conjugate of $W^{k^2}$. The convolution is performed by multiplying the FFT of the function $\tilde{G}_k W^{k^2}$ times the FFT of the function $W^{-k^2}$, followed by an inverse FFT. The computation of the weighting functions $W^{k^2}$ and $W^{-k^2}$ can be performed once at the beginning of the scan and used on all the acquired views F(t).

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital converter (ADC) 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image. In the preferred embodiment the ADC 209 operates at a fixed sample rate of 500 kHz so that complex pairs I and Q are sampled at a 250 kHz rate, yielding a maximum bandwidth of ±125 kHz.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

The present invention is implemented on the digitized I and Q samples of each acquired NMR signal F(t). A prescribed receive bandwidth is established prior to the scan, to provide the desired sampling interval $\Delta t$, and the number (M) of digitized samples is also prescribed. Referring particularly to FIG. 3, each view F(t) is acquired, digitized at sampling intervals $\Delta t_{A/D}$, Fourier transformed and stored as $\tilde{F}_k$. It is then processed according to the present invention to produce a data set G which is a representation of the view F(t) digitized at the prescribed sampling interval. The data sets $G_j$ are employed in the usual fashion to reconstruct an image at the completion of the scan as described above. The processing of the present invention is thus performed between the acquisition of each view F(t) and the use of that view in the image reconstruction process. This invention enables any arbitrary bandwidth to be prescribed (less than the fixed bandwidth of the receiver) with minimal impact on the image reconstruction time.

Referring particularly to FIG. 3, the first step as indicated by process block 300 is to initialize the data structures and compute the weighting functions:

$$W^{k^2} \qquad k = 0 \text{ to } M\text{-}1$$

$$FFT^{-1}\left(W^{-k^2}\right)$$

$$W^{j^2} \qquad j = 0 \text{ to } N\text{-}1$$

based on the ratio d of the prescribed sampling interval $\Delta t$ and the fixed sampling interval $\Delta t_{A/D}$ of the receiver, as well as the number of samples M in the acquired view. A loop is then entered in which each view of digitized NMR data is input at process block 302, Fourier transformed at process block 303, filtered by a window function $\tilde{H}_k$ at process block 304, and then processed according to the present invention.

The first step is to multiply the filtered view $\tilde{G}_k$ by the weighting function $W^{k^2}$ as indicated at process block 306. This product is then convolved as indicated by dashed line

308 with the weighting function $W^{-k^2}$. The convolution is performed by inverse Fourier transforming the product $\tilde{G}_k W^{k^2}$ at process block 310, and multiplying the result at process block 312 by the previously calculated function $$FFT^{-1}(W^{-k^2}).$$

The resulting product is then Fourier transformed at process block 314. In the final step the desired output $G_j$ for the image reconstruction process is produced by weighting the result of the convolution step with the weighting function $W^{j^2}$ as indicated at process block 316. Each acquired view $F_k$ is thus transformed into a corresponding data set $G_j$ and passed on to the image reconstruction process until the scan is complete as indicated at decision block 318.

As an example, assume the user has selected a readout bandwidth of ±100 kHz ($\Delta t = 5$ μsec) and a desired image matrix size of N=256. The fixed bandwidth of the receiver is ±125 kHz ($\Delta t_{A/D} = 4$ μsec) and a decimation ratio of d=1.25 is therefore required. The readout duration of the view $F_k$ is 256×5 μsec=1280 μsec and encompasses 320 samples at the 4 μsec sampling interval. The MRI system uses a bandlimiting filter $H_k$ which typically has 512 time domain points at 4 μsec intervals. To prevent wrap-around effects with the FFT implementation of the convolution for a filter of this length, the time domain data must be zero-padded to the next power of two greater than 320+512, i.e. 1024. The acquired data is therefore zero-padded to length M=1024, Fourier transformed, and multiplied by the bandlimiting window $\tilde{H}_k$, resulting in the data set $\tilde{G}_k$. The data set $\tilde{G}_k$ is then multiplied by $\tilde{W}^{k^2}$ and for convolution, the M=1024 samples must be padded to the next power of two greater than 1024+256, i.e. 2048. This is followed by an inverse FFT, multiplication by the inverse FFT of the $W^{-k^2}$ function and a forward FFT. Only N=256 points of the final data set are retained and multiplied by $W^{j^2}$ to form the output data set $G_j$.

The result achieved with the present invention is equivalent to the DFT and sinc interpolation methods for bandlimited functions, but with much lower computational overhead. If we define an "operation" as the multiplication of two complex numbers, the number of operations required by the present invention may be estimated as follows. Multiplication of $\tilde{G}_k$ and $W^{k^2}$ requires 1024 operations. Each FFT of the resulting data set requires 2×2048 $\log_2$ 2048 operations. There are two FFTs in the convolution step. Multiplication of the convolution result by $W^{j^2}$ requires 256 operations and the total number of operations is:

$$256+1024+4\times2048\ \log_2 2048 = 91{,}392.$$

By contrast, a conventional DFT interpolation solution of $\tilde{G}_k$ by explicit use of equation (5) with M=1024 and N=256 requires $$256\times1024 = 262{,}144$$

operations. This is almost three times the number of operations required by the present invention.

The invented method thus allows fractional decimation with a reasonable computational cost. Any bandwidth can be chosen by the operator, allowing a wider choice of signal-to-noise, data acquisition window length and chemical shift artifact. With sufficient computational horsepower, the method can be implemented to run in real time. Alternatively, the method can be implemented as part of the reconstruction process. In either case, the method is completely transparent to other reconstruction features.

What is claimed is:

1. A method for transforming an NMR signal ($F_k$) acquired at one sample rate ($1/\Delta t_{A/D}$) into an output NMR signal ($G_j$) of a prescribed sample rate ($1/\Delta t$), the steps comprising:

a) calculating a weighting function ($W^{k^2}$) based on the one sample rate, the prescribed sample rate and the total number of acquired samples (M);

b) producing a windowed NMR signal ($\tilde{G}_k$) by multiplying the Fourier transform of the NMR signal ($\tilde{F}_k$) with a window function ($\tilde{H}_k$);

c) multiplying the windowed NMR signal ($\tilde{G}_k$) by the weighting function ($W^{k^2}$);

d) convolving the result of step c) with the complex conjugate of the weighting function ($W^{k^2}$); and e) producing the output NMR signal ($G_j$) by multiplying the result of step d) with the weighting function ($W^{j^2}$).

2. The method as recited in claim 1 in which the convolving step ) is performed by:

f) inverse Fourier transforming the result of step c);

g) inverse Fourier transforming the complex conjugate weighting function ($W^{k^2}$);

h) multiplying the result of step f) by the result of step g); and i) Fourier transforming the result of step h).

\* \* \* \* \*

UNITED STATES PATENT AND TRADEMARK OFFICE
CERTIFICATE OF CORRECTION

PATENT NO. : 6,046,591
DATED : April 4, 2000
INVENTOR(S) : Kevin F. King, et al.

It is certified that error appears in the above-identified patent and that said Letters Patent is hereby corrected as shown below:

Column 1, line 17, "B)" should be --$B_0$)--.

Column 8, Claim 2, line 39, "step ) is" should be --step d) is--.

Signed and Sealed this

Eighth Day of May, 2001

*Attest:*

NICHOLAS P. GODICI

*Attesting Officer*  Acting Director of the United States Patent and Trademark Office